United States Patent
Atkins et al.

(10) Patent No.: US 10,732,515 B2
(45) Date of Patent: Aug. 4, 2020

(54) DETECTION AND MEASUREMENT OF DIMENSIONS OF ASYMMETRIC STRUCTURES

(71) Applicant: KLA-Tencor Corporation, Milpitas, CA (US)

(72) Inventors: Phillip R. Atkins, San Jose, CA (US); Qi Dai, San Jose, CA (US); Liequan Lee, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/138,813

(22) Filed: Sep. 21, 2018

(65) Prior Publication Data

US 2019/0094711 A1    Mar. 28, 2019

Related U.S. Application Data

(60) Provisional application No. 62/564,119, filed on Sep. 27, 2017.

(51) Int. Cl.
| | | |
|---|---|---|
| *G03F 7/20* | (2006.01) | |
| *G01B 11/06* | (2006.01) | |
| *G01N 21/21* | (2006.01) | |
| *G01N 21/95* | (2006.01) | |

(52) U.S. Cl.
CPC ...... *G03F 7/70625* (2013.01); *G01B 11/0625* (2013.01); *G01B 11/0641* (2013.01); *G01N 21/211* (2013.01); *G01N 21/9501* (2013.01); *G03F 7/705* (2013.01); *G01B 2210/56* (2013.01); *G01N 2021/213* (2013.01)

(58) Field of Classification Search
CPC ............ G03F 7/70625; G01B 11/0625; G01B 11/0641; G01N 21/211; G01N 21/9501; G01N 2021/213
See application file for complete search history.

(56) References Cited

U.S. PATENT DOCUMENTS

| | | |
|---|---|---|
| 5,166,752 A | 11/1992 | Spanier et al. |
| 5,608,526 A | 3/1997 | Piwonka-Corle et al. |
| 5,808,738 A | 9/1998 | Garcia-Rubio |

(Continued)

OTHER PUBLICATIONS

International Search Report dated Jan. 17, 2019, for PCT Application No. PCT/US2018/052507 filed on Sep. 25, 2018 by KLA-Tencor Corporation, 3 pages.

*Primary Examiner* — Dominic J Bologna
(74) *Attorney, Agent, or Firm* — Spano Law Group; Joseph S. Spano

(57) ABSTRACT

Methods and systems for performing spectroscopic measurements of asymmetric features of semiconductor structures are presented herein. In one aspect, measurements are performed at two or more azimuth angles to ensure sensitivity to an arbitrarily oriented asymmetric feature. Spectra associated with one or more off-diagonal Mueller matrix elements sensitive to asymmetry are integrated over wavelength to determine one or more spectral response metrics. In some embodiments, the integration is performed over one or more wavelength sub-regions selected to increase signal to noise ratio. Values of parameters characterizing an asymmetric feature are determined based on the spectral response metrics and critical dimension parameters measured by traditional spectral matching based techniques.

20 Claims, 8 Drawing Sheets

(56) References Cited

U.S. PATENT DOCUMENTS

| | | | |
|---|---|---|---|
| 5,859,424 A | 1/1999 | Norton et al. | |
| 6,429,943 B1 | 8/2002 | Opsal et al. | |
| 6,633,831 B2 | 10/2003 | Nikoonahad et al. | |
| 6,734,967 B1 | 5/2004 | Piwonka-Corle et al. | |
| 6,816,570 B2 | 10/2004 | Janik et al. | |
| 6,859,278 B1 | 2/2005 | Johs et al. | |
| 6,895,075 B2 | 5/2005 | Yokhin et al. | |
| 6,972,852 B2 | 12/2005 | Opsal et al. | |
| 7,061,627 B2 | 6/2006 | Opsal et al. | |
| 7,478,019 B2 | 1/2009 | Zangooie et al. | |
| 7,755,764 B2 | 7/2010 | Kwak et al. | |
| 7,826,071 B2 | 11/2010 | Shchegrov et al. | |
| 7,907,264 B1 | 3/2011 | Krishnan | |
| 7,929,667 B1 | 4/2011 | Zhuang et al. | |
| 7,933,026 B2 | 4/2011 | Opsal et al. | |
| 8,525,993 B2 | 9/2013 | Rabello | |
| 8,860,937 B1 | 10/2014 | Dziura et al. | |
| 9,223,227 B2 | 12/2015 | Bhattacharyya | |
| 9,255,877 B2 | 2/2016 | Veldman et al. | |
| 9,291,554 B2 | 3/2016 | Kuznetsov et al. | |
| 9,310,290 B2 | 4/2016 | Wang et al. | |
| 9,470,639 B1* | 10/2016 | Zhuang | G01N 21/9501 |
| 9,915,522 B1 | 3/2018 | Jiang et al. | |
| 2011/0080585 A1* | 4/2011 | Rabello | G01N 21/211 356/368 |
| 2012/0250032 A1 | 10/2012 | Wilde et al. | |
| 2013/0114085 A1 | 5/2013 | Wang et al. | |
| 2014/0111791 A1 | 4/2014 | Manassen et al. | |
| 2014/0172394 A1 | 6/2014 | Kuznetsov et al. | |
| 2014/0222380 A1 | 8/2014 | Kuznetsov et al. | |
| 2014/0297211 A1 | 10/2014 | Pandev et al. | |
| 2014/0316730 A1 | 10/2014 | Shchegrov et al. | |
| 2014/0347666 A1* | 11/2014 | Veldman | G01N 21/211 356/369 |
| 2014/0375983 A1 | 12/2014 | Wolf et al. | |
| 2015/0042984 A1 | 2/2015 | Pandev et al. | |
| 2015/0046118 A1 | 2/2015 | Pandev et al. | |
| 2015/0193926 A1 | 7/2015 | Berlatzky et al. | |
| 2015/0204664 A1 | 7/2015 | Bringoltz et al. | |
| 2016/0139032 A1 | 5/2016 | Rampoldi et al. | |
| 2016/0161245 A1 | 6/2016 | Fu et al. | |

\* cited by examiner

DETECTION AND MEASUREMENT OF DIMENSIONS OF ASYMMETRIC STRUCTURES

CROSS REFERENCE TO RELATED APPLICATION

The present application for patent claims priority under 35 U.S.C. § 119 from U.S. provisional patent application Ser. No. 62/564,119, entitled "Detection And Measurement of Dimensions of Asymmetric Structures," filed Sep. 27, 2017, the subject matter of which is incorporated herein by reference in its entirety.

TECHNICAL FIELD

The described embodiments relate to metrology systems and methods, and more particularly to methods and systems for improved measurement of semiconductor structures.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical metrology techniques offer the potential for high throughput without the risk of sample destruction. A number of optical metrology based techniques including scatterometry and reflectometry implementations and associated analysis algorithms are commonly used to characterize critical dimensions, film thicknesses, composition, overlay and other parameters of nanoscale structures.

Many optical metrology systems measure physical properties of a specimen indirectly. In most cases, the measured optical signals cannot be used to directly determine the physical properties of interest.

Traditionally, the measurement process consists of formulating a metrology model that attempts to predict the measured optical signals based on a model of the interaction of the measurement target with the particular metrology system. The measurement model includes a parameterization of the structure in terms of the physical properties of the measurement target that are of interest (e.g., film thicknesses, critical dimensions, refractive indices, grating pitch, etc.). In addition, the measurement model includes a parameterization of the measurement tool itself (e.g., wavelengths, angles of incidence, polarization angles, etc.). For example, machine parameters are parameters used to characterize the metrology tool itself. Exemplary machine parameters include angle of incidence (AOI), analyzer angle ($A_O$), polarizer angle ($P_O$), illumination wavelength, numerical aperture (NA), etc. Specimen parameters are parameters used to characterize the geometric and material properties of the specimen. For a thin film specimen, exemplary specimen parameters include refractive index, dielectric function tensor, nominal layer thickness of all layers, layer sequence, etc.

For measurement purposes, the machine parameters are treated as known, fixed parameters and the specimen parameters, or a subset of specimen parameters, are treated as unknown, floating parameters. The floating parameters are resolved by a fitting process (e.g., regression, library matching, etc.) that produces the best fit between theoretically predicted spectral data derived from the measurement model and measured spectral data. The unknown specimen parameters are varied and the modelled spectra are calculated and compared with the measured spectral data in an iterative manner until a set of specimen parameter values are determined that results in a close match between the modelled and measured spectra.

This traditional model-based measurement approach has been applied to the estimation of parameters describing asymmetric structural features and symmetric structural features. In some examples, the estimation of parameters describing asymmetric structural features is improved by emphasizing matching modelled and measured spectra associated with specific off-diagonal Mueller elements. This approach is described in further detail in U.S. Pat. No. 8,525,993 to Rabello et al., the content of which is incorporated herein by reference in its entirety.

Unfortunately, in many cases, some parameters of interest, in particular, parameters describing asymmetric structural features, are weakly correlated with the measured spectral response. In these cases, changes in the parameters that describe an asymmetric structural feature do not result in significant changes in the resulting spectra. This increases the uncertainty of the regressed values of these parameters due to both measurement noise and errors in the measurement model.

Furthermore, spectral fitting methods typically involve achieving the best fit for several model parameters. Multiple model parameters are varied while searching for the set of parameters that provides the best match between the simulated spectra and the measured spectra. This increases the dimension of the search space for the best fit and often de-emphasizes parameters that are weakly correlated with the measured spectral response, in particular, parameters describing asymmetric structural features.

In addition, model-based measurements of parameters of interest are often based on a measurement of the structure of interest from a single plane of incidence. If the asymmetric feature lies along the plane of incidence, the resulting spectral signals (e.g., one or more off-diagonal Mueller signals) may be insensitive to the asymmetry.

As a result, it is often not possible to reliably determine parameters describing asymmetric structural features by matching modelled spectra with measured spectra using traditional techniques.

In summary, ongoing reductions in feature size and increasing depths of structural features impose difficult requirements on optical metrology systems. Optical metrology systems must meet high precision and accuracy requirements for increasingly complex targets at high throughput to remain cost effective. Many structural features of interest exhibit asymmetry. In particular, fabrication of advanced memory structures involves deep holes that frequently exhibit asymmetry. In this context, reliable measurement of asymmetric structural features has emerged as an important factor in the effectivity of optical metrology systems. Thus, improved metrology systems and methods to overcome limitations associated with measurement of asymmetric structural features are desired.

SUMMARY

Methods and systems for performing spectroscopic measurements of asymmetric features of semiconductor structures are presented herein. Measured spectra are processed to emphasize the measurement of symmetry breaking defects that arise from the fabrication of advanced semiconductor structures.

In one aspect, a value of one or more geometric parameters describing an asymmetric feature of the structure of interest is determined based on values of one or more critical dimension parameters reliably estimated by spectral matching and one or more spectral response metrics. Spectral response metrics are scalar values derived from spectra associated with one or more off-diagonal Mueller matrix elements. In general, the spectral response metrics are dependent on the asymmetric feature and other critical dimensions reliably determined by spectral matching.

In some embodiments, a trained linear model relates an asymmetry parameter to one or more spectral response metrics and one or more critical dimensions reliably determined by spectral matching. An estimated value of the asymmetry parameter is determined by regression of the trained model.

In some embodiments, a trained neural network model maps the measured spectral response metrics and critical dimension parameters to the value of the asymmetry parameter.

In some embodiments, a combination of models, such as a trained linear model and a trained neural network model are employed to estimate the value of one or more asymmetry parameters.

In a further aspect, spectral measurements of a structure of interest are performed at two or more different azimuth angles. The resulting measurements are employed to estimate one or more geometric parameters characterizing an asymmetric feature of the structure. In a preferred embodiment, spectral measurements are performed at two azimuth angles orthogonal to one another. The combination of multiple orthogonal measurements enables precise estimation of geometric parameters characterizing an asymmetric feature of the structure of interest and the axis along which the asymmetric feature lies.

In another further aspect, spectral response metrics are determined by integrating measured spectra associated with one or more off-diagonal elements of the Mueller matrix. A spectral response metric is a scalar measure of the spectral response due to asymmetry. Integration over the measured spectra reduces noise and increases signal strength associated with the Mueller matrix element or combination of Mueller matrix elements.

In another further aspect, one or more sub-ranges of wavelengths associated with one or more off-diagonal elements of the Mueller matrix are selected. Furthermore, spectral response metrics are determined by integrating the spectra associated with the one or more off-diagonal elements of the Mueller matrix across the selected sub-ranges of wavelengths. In some examples, determining a spectral response metric based on selected portions of the available measured spectrum increases sensitivity of the spectral response metric to the parameter(s) describing the asymmetry feature. This is achieved by emphasizing wavelengths of greatest sensitivity to the asymmetric feature and diminishing the effects of random noise via integration.

In a further aspect, different spectral response metrics are weighed differently, e.g., by scaling each spectral response metrics with a different constant. In this manner, spectral response metrics that are more sensitive to specific asymmetry parameters are weighed more heavily than spectral response metrics that are less sensitive to the specific asymmetry parameters In yet another aspect, the measurement results described herein are provided as active feedback to a fabrication process tool (e.g., lithography tool, etch tool, deposition tool, etc.).

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for performing spectroscopic measurements of asymmetric features of semiconductor structures are presented herein. Measured spectra are processed to emphasize the measurement of symmetry breaking defects that arise from the fabrication of advanced semiconductor structures. For example, controlling the process of etching deep holes has emerged as a critical process requirement in the fabrication of high aspect ratio memory structures, e.g., three dimensional NAND memory. Measurements of a structure of interest are performed at two or more azimuth angles to ensure sensitivity to an arbitrarily oriented asymmetric feature. Spectra associated with one or more off-diagonal Mueller matrix elements sensitive to asymmetry are selected for further analysis. The selected spectra are further subdivided into one or more wavelength sub-regions selected to increase signal to noise ratio. The selected spectra are integrated over the selected wavelength sub-regions to generate spectral response metrics associated with the off-diagonal Mueller matrix elements. Values of parameters characterizing the geometry of an asymmetric feature are determined based on the spectral response metrics and critical dimension parameters measured by traditional spectral matching based techniques. These features, individually, or in combination, enable high throughput measurements of asymmetric features of high aspect ratio structures (e.g., structures having depths of one micrometer or more) with high throughput, precision, and accuracy.

Figure 1:
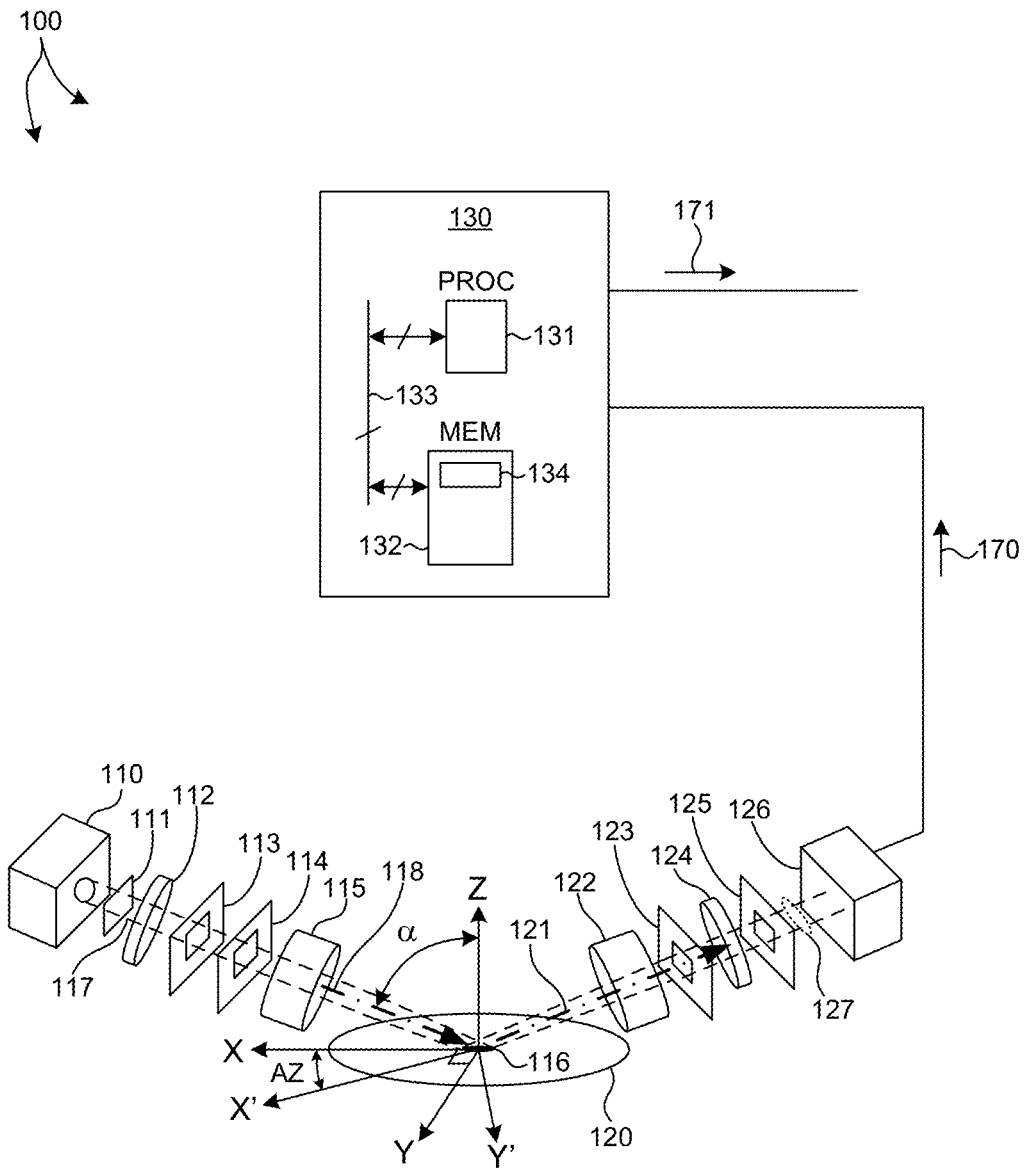
FIG. 1 depicts a metrology system 100 for performing spectroscopic measurements of asymmetric structural features in one embodiment.

FIG. 1 depicts an exemplary, metrology system 100 for performing measurements of asymmetric structural features of semiconductor structures. In some examples, the semiconductor structures include at least one high aspect ratio (HAR) structure. As depicted in FIG. 1, metrology system 100 is configured as a broadband spectroscopic ellipsometer. However, in general, metrology system 100 may be configured as a spectroscopic reflectometer, scatterometer, ellipsometer, or any combination thereof.

Metrology system 100 includes an illumination source 110 that generates a beam of illumination light 117 incident on a wafer 120. In some embodiments, illumination source 110 is a broadband illumination source that emits illumination light in the ultraviolet, visible, and infrared spectra. In one embodiment, illumination source 110 is a laser sustained plasma (LSP) light source (a.k.a., laser driven plasma source). The pump laser of the LSP light source may be continuous wave or pulsed. A laser-driven plasma source can produce significantly more photons than a Xenon lamp across the entire wavelength range from 150 nanometers to 2000 nanometers. Illumination source 110 can be a single light source or a combination of a plurality of broadband or discrete wavelength light sources. The light generated by illumination source 110 includes a continuous spectrum or parts of a continuous spectrum, from ultraviolet to infrared (e.g., vacuum ultraviolet to mid infrared). In general, illumination light source 110 may include a super continuum laser source, an infrared helium-neon laser source, an arc lamp, or any other suitable light source.

In a further aspect, the amount of illumination light is broadband illumination light that includes a range of wavelengths spanning at least 500 nanometers. In one example, the broadband illumination light includes wavelengths below 250 nanometers and wavelengths above 750 nanometers. In general, the broadband illumination light includes wavelengths between 120 nanometers and 3,000 nanometers. In some embodiments, broadband illumination light including wavelengths beyond 3,000 nanometers may be employed.

As depicted in FIG. 1, metrology system 100 includes an illumination subsystem configured to direct illumination light 117 to one or more structures formed on the wafer 120. The illumination subsystem is shown to include light source 110, one or more optical filters 111, polarizing component 112, field stop 113, aperture stop 114, and illumination optics 115. The one or more optical filters 111 are used to control light level, spectral output, or both, from the illumination subsystem. In some examples, one or more multi-zone filters are employed as optical filters 111. Polarizing component 112 generates the desired polarization state exiting the illumination subsystem. In some embodiments, the polarizing component is a polarizer, a compensator, or both, and may include any suitable commercially available polarizing component. The polarizing component can be fixed, rotatable to different fixed positions, or continuously rotating. Although the illumination subsystem depicted in FIG. 1 includes one polarizing component, the illumination subsystem may include more than one polarizing component. Field stop 113 controls the field of view (FOV) of the illumination subsystem and may include any suitable commercially available field stop. Aperture stop 114 controls the numerical aperture (NA) of the illumination subsystem and may include any suitable commercially available aperture stop. Light from illumination source 110 is directed through illumination optics 115 to be focused on one or more structures (not shown in FIG. 1) on wafer 120. The illumination subsystem may include any type and arrangement of optical filter(s) 111, polarizing component 112, field stop 113, aperture stop 114, and illumination optics 115 known in the art of spectroscopic ellipsometry, reflectometry, and scatterometry.

As depicted, in FIG. 1, the beam of illumination light 117 passes through optical filter(s) 111, polarizing component 112, field stop 113, aperture stop 114, and illumination optics 115 as the beam propagates from the illumination source 110 to wafer 120. Beam 117 illuminates a portion of wafer 120 over a measurement spot 116.

Metrology system 100 also includes a collection optics subsystem configured to collect light generated by the interaction between the one or more structures and the incident illumination beam 117. A beam of collected light 127 is collected from measurement spot 116 by collection optics 122. Collected light 127 passes through collection aperture stop 123, polarizing element 124, and field stop 125 of the collection optics subsystem.

Collection optics 122 includes any suitable optical elements to collect light from the one or more structures formed on wafer 120. Collection aperture stop 123 controls the NA of the collection optics subsystem. Polarizing element 124 analyzes the desired polarization state. The polarizing element 124 is a polarizer or a compensator. The polarizing element 124 can be fixed, rotatable to different fixed positions, or continuously rotating. Although the collection subsystem depicted in FIG. 1 includes one polarizing element, the collection subsystem may include more than one polarizing element. Collection field stop 125 controls the field of view of the collection subsystem. The collection subsystem takes light from wafer 120 and directs the light through collection optics 122, and polarizing element 124 to be focused on collection field stop 125. In some embodiments, collection field stop 125 is used as a spectrometer slit for the spectrometers of the detection subsystem. However, collection field stop 125 may be located at or near a spectrometer slit of the spectrometers of the detection subsystem.

The collection subsystem may include any type and arrangement of collection optics 122, aperture stop 123, polarizing element 124, and field stop 125 known in the art of spectroscopic ellipsometry, reflectometry, and scatterometry.

In the embodiment depicted in FIG. 1, the collection optics subsystem directs light to spectrometer 126. Spectrometer 126 generates output responsive to light collected from the one or more structures illuminated by the illumination subsystem. In one example, the detectors of spectrometer 126 are charge coupled devices (CCD) sensitive to ultraviolet and visible light (e.g., light having wavelengths between 190 nanometers and 860 nanometers). In other examples, one or more of the detectors of spectrometer 126 is a photo detector array (PDA) sensitive to infrared light (e.g., light having wavelengths between 950 nanometers and 2500 nanometers). However, in general, other detector technologies may be contemplated (e.g., a position sensitive detector (PSD), an infrared detector, a photovoltaic detector, etc.). Each detector converts the incident light into electrical signals indicative of the spectral intensity of the incident light. In general, spectrometer 126 generates output signals 170 indicative of the spectral response of the structure under measurement to the illumination light.

Metrology system 100 also includes computing system 130 configured to receive signals 170 indicative of the measured spectral response of the structure of interest and estimate values of one or more geometric parameters 171 describing an asymmetric feature of the measured structure(s) based on the measured spectral response.

In general, the measured spectral response of the structure of interest includes spectra associated with elements of a Mueller matrix formulation employed to characterize the measured response. The Stokes-Mueller formalism describes the response of a medium to excitation by polarized light. Equation (1) illustrates a Mueller matrix, M, which describes the relationship between the incident beam, characterized by Stokes vector, $S_I$, and the reflected beam characterized by Stokes vector, $S_R$.

$$S_R = MS_I \quad (1)$$

In general, the Stokes vector represents the state of polarization of a light wave. By way of example, Equation (2) illustrates a Stokes vector, S, where I is the total intensity, $I_0$ is the intensity transmitted by a linear polarizer oriented at an angle of zero degrees with respect to the P polarization axis in the plane perpendicular to the propagation direction, $I_{45}$ is the transmitted by a linear polarizer oriented at an angle of 45 degrees with respect the P polarization axis in a plane perpendicular to the propagation direction, $I_{-45}$ is the intensity transmitted by a linear polarizer oriented at an angle of −45 degrees with respect the P polarization axis in a plane perpendicular to the propagation direction, $I_R$ is the intensity transmitted by a right circular polarizer, and $I_L$ is the intensity transmitted by a left circular polarizer. The quantities in brackets are spatially and temporally averaged.

$$S = \begin{bmatrix} I \\ \langle I_0 - I_{90} \rangle \\ \langle I_{45} - I_{-45} \rangle \\ \langle I_R - I_L \rangle \end{bmatrix} \quad (2)$$

For a particular spectroscopic measurement, the illumination intensity and polarization properties of the incident beam are programmed. Thus, some or all of the elements of the Stokes vector associated with the incident beam, $S_I$, are known apriori. Furthermore, intensity and polarization properties of reflected beam are measured by the spectrometer (i.e., spectrometer 126). Thus, some or all of the elements of the Stokes vector associated with the reflected beam, $S_R$, are measured. As a result, some or all of the Mueller matrix elements are resolved based on the known and measured properties of the incident and reflected light, respectively. Equation [3] illustrates the elements of the Mueller matrix and their relationship with the known and measured elements of the Stokes vectors, $S_I$ and $S_R$, respectively.

$$S_R = \begin{bmatrix} M_{00} & M_{01} & M_{02} & M_{03} \\ M_{10} & M_{11} & M_{12} & M_{13} \\ M_{20} & M_{21} & M_{22} & M_{23} \\ M_{30} & M_{31} & M_{32} & M_{33} \end{bmatrix} S_I \quad (3)$$

Some or all of the elements of the Mueller matrix may be determined directly from the known elements of the Stokes vectors, $S_I$ and $S_R$, based on the linear relationship illustrated in Equation [3]. Whether some or all of the Mueller matrix elements are determined depends on the known intensity and polarization properties of the incident light and the measured intensity and polarization properties of the reflected light. For example, if polarizer 112 is configured as a rotating polarizer and polarizer 124 is configured as a rotating analyzer, the element in the first three rows and the first three columns of the Mueller matrix may be determined. If, in addition, rotating compensators are employed in the illumination path and the collection path of metrology system 100, all elements of the 4×4 Mueller matrix may be determined.

In a further aspect, values of one or more critical dimension parameters are determined based on a fitting of a modelled spectral response to the measured spectral response associated with one or more elements of the Mueller matrix. Typically, many critical dimension parameters that do not describe asymmetric features of a structure under measurement are reliably estimated based on spectral matching across one or more Mueller matrix elements. However, geometric parameters that describe asymmetric features of a structure are typically not reliably estimated by spectral matching, even in cases where spectral matching associated with specific off-diagonal elements of the Mueller matrix is employed.

In one aspect, a value of one or more geometric parameters describing an asymmetric feature of the structure of interest is determined based on values of one or more critical dimension parameters reliably estimated by spectral matching and one or more spectral response metrics. The spectral response metrics are scalar values derived from spectra associated with one or more off-diagonal Mueller matrix elements. In general, the spectral response metrics are dependent on the asymmetric feature and other critical dimensions that are reliably determined by spectral matching. The inventors have discovered that decoupling the estimation of critical dimension parameters via spectral matching from the estimation of asymmetry parameter values improves the measurement of asymmetry parameter values. In some embodiments, a trained linear model relates an asymmetry parameter to one or more spectral response metrics and one or more critical dimensions reliably determined by spectral matching. An estimated value of the asymmetry parameter is determined by regression of the trained model. In some embodiments, a trained neural network model maps the measured spectral response metrics and critical dimension parameters to the value of the asymmetry parameter. In some embodiments, a combination of models, such as a trained linear model and a trained neural network model are employed to estimate the value of one or more asymmetry parameters. In general, any suitable modeling methodology may be employed to estimate the value of one or more asymmetry parameters.

Figure 2:
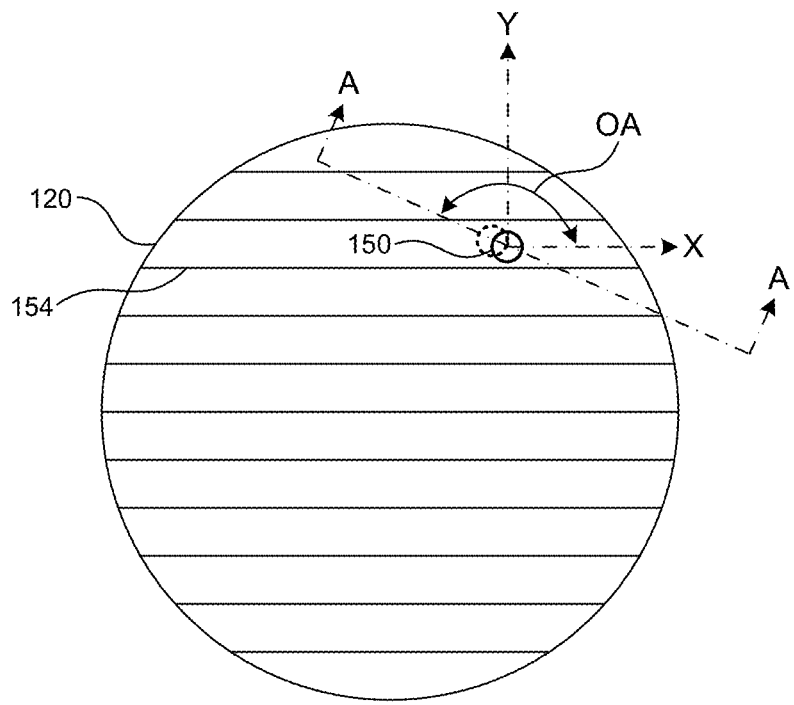
FIG. 2 depicts a top view of wafer 120 depicted in FIG. 1 including a tilted hole feature 150.

FIG. 2 depicts an asymmetric hole feature 150 fabricated on wafer 120. As depicted in FIG. 2, an X-Y coordinate frame is attached to wafer 120. The X-axis of the X-Y coordinate frame is aligned with scribe lines 154 of wafer 120. As depicted in FIG. 2, hole feature 150 is not normal to the surface of wafer 120. The direction of skew of the hole feature is oriented at an angle, OA, with respect to the direction of the scribe lines 154 of wafer 120. Similarly, the direction of skew of the hole feature is at an orientation angle, OA, with respect to the X-direction of the X-Y coordinate frame attached to wafer 120.

Figure 3:
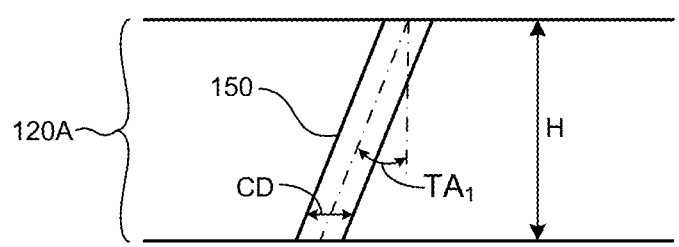
FIG. 3 depicts a cross-sectional view of section A depicted in FIG. 2.

FIG. 3 depicts cross-sectional view A-A aligned with the direction of skew of hole feature 150 depicted in FIG. 1. Specifically, FIG. 3 depicts a top layer or sequence of layers 120A immediately below the surface of wafer 120. As depicted in FIG. 3, hole feature 150 is tilted at an angle, TA, with respect to a surface normal of wafer 120. In the example depicted in FIGS. 2 and 3, the asymmetrical hole feature 150 is described by two asymmetry parameters: orientation angle, OA, and tilt angle, TA.

Figure 4:
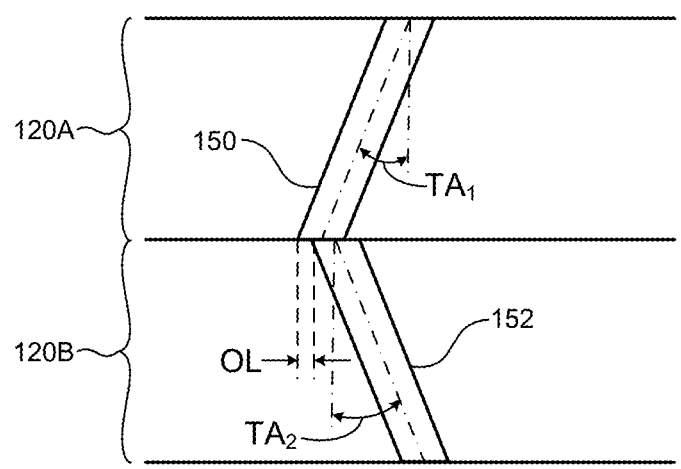
FIG. 4 depicts a cross-sectional view of section A depicted in FIG. 2, including multiple hole sections.

FIG. 4 depicts cross-sectional view A-A aligned with the direction of skew of hole feature 150 depicted in FIG. 1. Specifically, FIG. 4 depicts a top layer or sequence of layers 120A immediately below the surface of wafer 120 and a buried layer or sequence of layers 120B immediately below layer(s) 120A. As depicted in FIG. 4, hole section 150 is tilted at an angle, TA1, with respect to a surface normal of wafer 120 and hole section 152 is tilted at an angle, TA2, with respect to the surface normal of wafer 120. In addition, hole section 152 is shifted horizontally (i.e., in a direction parallel to the surface of wafer 120) with respect to hole section 150 by an overlay offset, OL. In the example depicted in FIG. 4, the asymmetrical hole sections 150 and 152 are described by four asymmetry parameters: orientation angle, OA, tilt angles, $TA_1$ and $TA_2$, and overlay offset, OL.

Tilted hole sections 150 and 152 are provided by way of non-limiting example. In general, many different structures may exhibit asymmetric features. Furthermore, the same asymmetric features may be described by different sets of asymmetry parameters. In one example, asymmetric hole features may also be parameterized by the elliptical shape of the holes.

In a further aspect, spectral measurements of a structure of interest are performed at two or more different azimuth angles. The resulting measurements are employed to estimate one or more geometric parameters characterizing an asymmetric feature of the structure of interest as described herein. In a preferred embodiment, spectral measurements are performed at two azimuth angles orthogonal to one another. The combination of multiple orthogonal measurements enables precise estimation of geometric parameters characterizing an asymmetric feature of the structure of interest and the axis along which the asymmetric feature lies. For example, if the asymmetric feature lies along the plane of incidence of one measurement, the orthogonal measurement will be sensitive to the asymmetry.

As depicted in FIG. 1, the Z-axis is oriented normal to the surface of wafer 120. The X and Y axes are coplanar with the surface of wafer 120, and thus perpendicular to the Z-axis. Similarly, the X' and Y' axes are coplanar with the surface of wafer 120, and thus perpendicular to the Z-axis. The X' and Y' axes are rotated with respect to the X and Y axes by an azimuth angle, AZ. The azimuth angle specifies the orientation of light delivery to wafer 120 about the Z-axis. The chief ray 118 of the beam of illumination light 117 and the chief ray 121 of the beam of collected light 127 define a plane of incidence. The X'-axis is aligned with the plane of incidence and the Y'-axis is orthogonal to the plane of incidence. In this manner, the plane of incidence lies in the X'Z plane. The beam of illumination light 117 is incident on the surface of wafer 120 at an angle of incidence, a, with respect to the Z-axis and lies within the plane of incidence.

In general, the orientation of an asymmetrical feature with respect to the wafer under measurement is unknown apriori. Measurements at multiple azimuth angles ensure that at least one of the measurements is sensitive to the asymmetric feature. In addition, performing measurements at two orthogonal azimuth angles increases the likelihood of accurately determining the axis of asymmetry. This is achieved, for example, by measuring the orientation angle of an asymmetric feature with respect to the plane of incidence of a first set of measurements and measuring the orientation angle of the asymmetric feature with respect to a second plane of incidence associated with a second set of measurements. As the orientations of the planes of incidence associated with the two measurements are known with respect to the wafer, the orientation angle of the asymmetric feature with respect to the wafer is directly determined from both measurements. In many measurement scenarios, both measurements provide an independent estimate of the orientation angle with respect to the wafer. However, in some scenarios, where the asymmetric feature is aligned with the plane of incidence of a particular measurement, the measurement is not sensitive to the asymmetry. In these scenarios, the orthogonal measurement is most sensitive to the same asymmetric feature, and thus provides the most reliable estimate of the orientation angle of the asymmetric feature with respect to the wafer.

In general, measurements at multiple different azimuth angles increase the signal information available and enhance measurement accuracy of asymmetric features. Hence, although examples are provided herein that refer to measurements at two orthogonal angles, in general, any number of measurements at different azimuth angles may be employed to enhance measurement accuracy in accordance with the methods described herein.

In a further aspect, one or more spectral response metrics each associated with one or more off-diagonal elements of the Mueller matrix are determined by integrating measured spectra associated with the one or more off-diagonal elements of the Mueller matrix. A spectral response metric is a scalar measure of the spectral response due to asymmetry. Integration over the measured spectra reduces noise and increases signal strength associated with the Mueller matrix element or combination of Mueller matrix elements.

In one example, illustrated by equation (4), spectra associated with Mueller matrix element $M_{30}$ are integrated over wavelength.

$$SRM_{M_{30}} = \int_{\lambda min}^{\lambda max} (M_{30}) d\lambda \qquad (4)$$

In some examples the integration is performed over the sum of multiple elements of the Mueller matrix. Equation (5) illustrates a spectral response metric determined by integrating spectra associated with the sum of Mueller matrix elements $M_{20}$ and $M_{02}$.

$$SRM_{M_{02}+M_{20}} = \int_{\lambda_{min}}^{\lambda_{max}} (M_{02} + M_{20}) d\lambda \qquad (5)$$

In a preferred embodiment, the sum of off-diagonal Mueller matrix elements $M_{02}$ and $M_{20}$ is employed as a spectral response metric because the sum $M_{02}+M_{20}$ is equal to zero in the absence of asymmetry. As such, the measure of asymmetry is expressed by the deviation of $SRM_{M02+M20}$ from zero. Similarly, in a preferred embodiment, the off-diagonal Mueller matrix element $M_{30}$ is employed as a spectral response metric because $M_{30}$ is equal to zero in the absence of asymmetry. As such, the measure of asymmetry is expressed by the deviation of $SRM_{M30}$ from zero. In another preferred embodiment, both spectral response metrics $SRM_{M02+M20}$ and $SRM_{M30}$ are employed to estimate a value of one or more geometric parameters describing an asymmetric feature of a structure of interest as described herein.

Although spectral response metrics based on $M_{30}$ and the sum $(M_{02}+M_{20})$ are specifically described herein, in general, spectral response metrics based on any suitable Mueller matrix element or combination of Mueller matrix elements may be contemplated within the scope of this patent document. For example, a spectral response metric may be determined based on $M_{03}$, the sum $(M_{12}+M_{21})$, etc.

In another aspect, spectra associated with one or more off-diagonal elements of the Mueller matrix are subdivided into one or more sub-ranges of wavelengths. Furthermore, the spectral response metrics are determined by integrating the spectra associated with the one or more off-diagonal elements of the Mueller matrix across the one or more sub-ranges of wavelengths. In some examples, determining a spectral response metric based on selected portions of the available measured spectrum increases sensitivity of the spectral response metric to the parameter(s) describing the asymmetry feature. This is achieved by emphasizing wavelengths of greatest sensitivity to the asymmetric feature and diminishing the effects of random noise via integration.

Figure 5:
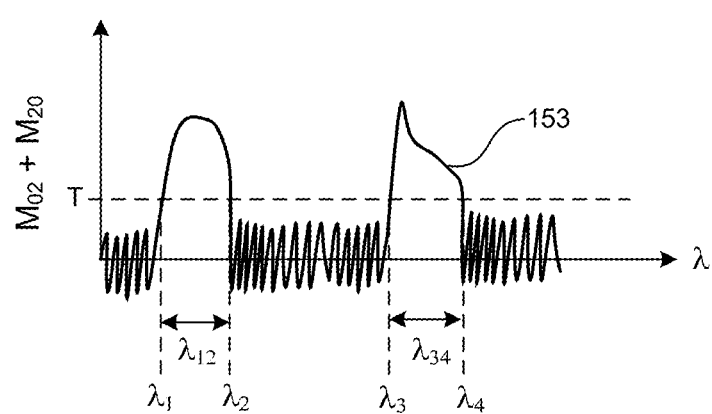
FIG. 5 depicts an illustration of a spectral response 153 associated with the sum of Mueller matrix elements $M_{02}$ and $M_{20}$.

FIG. 5 depicts an illustrative spectral response 153 associated with the sum $(M_{02}+M_{20})$. As depicted in FIG. 5, significant portions of the spectrum of the signal response are within the noise floor of the measurement, while other portions of the spectrum exhibit a signal response that significantly exceeds the noise floor of the measurement. In one example, the portions of the spectrum that exceed a predetermined threshold value, T, are selected from the spectrum to identify the signal response that exceeds the noise floor. In the illustrated example, wavelength sub-ranges, $\lambda_{12}$ and $\lambda_{34}$ are selected from the available spectrum. Furthermore, a spectral response metric associated with the sum $(M_{02}+M_{20})$ is determined by integrating the sum $(M_{02}+M_{20})$ over only the selected sub-ranges as illustrated by equation (6).

$$SRM = \int_{\lambda_1}^{\lambda_2}(M_{02}+M_{20})d\lambda + \int_{\lambda_3}^{\lambda_4}(M_{02}+M_{20})d\lambda \qquad (6)$$

In the example depicted in FIGS. 2 and 3, the asymmetry of a tilted hole 150 is characterized by tilt angle, TA, and orientation angle, OA. In addition, the tilted hole is characterized by other critical dimension that do not describe the asymmetry of the hole feature, such as the height, H, of the hole, and the diameter, CD, of the hole. The orientation angle, OA, is defined with respect to the positive direction of the X-axis depicted in FIG. 1. Thus, when the orientation angle is zero, the asymmetric feature skews in the positive direction of the X-axis. Similarly, when the orientation angle is 90 degrees, the asymmetric feature skews in the positive direction of the Y-axis. The tilt angle, TA, is defined to be zero when the central axis of the hole is normal to the wafer (i.e., no skew).

In one example, metrology system 100 is employed to perform spectroscopic measurements of tilted hole 150 at two orthogonal azimuth angles. In one measurement, the plane of incidence of the illumination light is aligned with the X-axis depicted in FIG. 1. In another measurement, the plane of incidence of the illumination light is aligned with the Y-axis depicted in FIG. 1.

The measured spectra 170 associated with all available Mueller matrix elements at both azimuth angles are received by computing system 130. Computing system 130 determines several spectral response metrics based on the measured spectra. In one example, computing system 130 determines spectral response metrics by integration of selected portions of Mueller element $M_{30}$ and the sum of Mueller matrix elements $(M_{20}+M_{02})$ for both azimuth angles. Equations (7)-(10) illustrate spectral response metrics determined by integrating over $N\lambda$ segments of the available spectrum of $(M_{20}+M_{02})$ measured at a 180 degree azimuth angle, $N\lambda$ segments of the available spectrum of $M_{30}$ measured at 180 degree azimuth angle, $N\lambda$ segments of the available spectrum of $(M_{20}+M_{02})$ measured at a 90 degree azimuth angle, and $N\lambda$ segments of the available spectrum of $M_{30}$ measured at a 90 degree azimuth angle, respectively. Subscript, a, denotes the sum of Mueller matrix elements $(M_{20}+M_{02})$ and subscript, b, denotes Mueller matrix elements $M_{30}$. Although the spectral response metrics illustrated by equations (7)-(10) are each determined by integrating over $N\lambda$ segments of the available spectra, in general, the wavelength segments selected for integration may be unique for each spectral response metric.

$$SRM_{a,180} = \Sigma_{i=1}^{N\lambda} \int_{\lambda_{i,Min}}^{\lambda_{i,Max}} (M_{20}+M_{02}) d\lambda \qquad (7)$$

$$SRM_{b,180} = \Sigma_{i=1}^{N\lambda} \int_{\lambda_{i,Min}}^{\lambda_{i,Max}} M_{30} d\lambda \qquad (8)$$

$$SRM_{a,90} = \Sigma_{i=1}^{N\lambda} \int_{\lambda_{i,Min}}^{\lambda_{i,Max}} (M_{20}+M_{02}) d\lambda \qquad (9)$$

$$SRM_{b,90} = \Sigma_{i=1}^{N\lambda} \int_{\lambda_{i,Min}}^{\lambda_{i,Max}} M_{30} d\lambda \qquad (10)$$

Computing system 130 also estimates values of hole height, H, hole diameter, CD, hole tilt angle, TA, and orientation angle, OA, by model based spectral matching with any combination of the available Mueller matrix elements. As discussed hereinbefore, reliable estimates of H and CD are expected from model based spectral matching, but the estimated values of TA and OA are typically inaccurate.

Computing system 130 estimates values of TA and OA based on the spectral response metrics described with reference to Equations (7)-(10) and the values of CD and H estimated by spectral matching.

In some examples, computing system 130 generates a trained linear model that is subsequently employed to estimate values of TA and OA.

It is assumed that the values of the spectral response metrics, SRM, depend on CD, H, TA, and OA. In general, the dependence on CD and H may not be independent of the dependence on TA and OA. Equation (11) illustrates the assumption that a spectral response metric, SRM, depends on CD, H, TA, and OA, but the dependence can be expressed as a combination of a function, g, which depends on CD and H, and a function, h, which depends on TA and OA.

$$SRM(CD, \text{Height}, TA, OA) = g(CD, \text{Height}) \cdot h(TA, OA) \qquad (11)$$

It is assumed that, function, h, is directly proportional to the degree of the tilt angle, TA, along the respective light axis as illustrated in equations (12)-(13).

$$h_{90}(TA,OA) \propto \cos(OA) \cdot \text{Height} \cdot \tan(TA) \quad (12)$$

$$h_{180}(TA,OA) \propto \sin(OA) \cdot \text{Height} \cdot \tan(TA) \quad (13)$$

The function, g, is assumed to be insensitive to TA and OA, and consideration of this function can be effectively decoupled from the consideration of the function, h. In addition, the inventors have discovered that function, g, is approximately the same for each of the four spectral response metrics, $SRM_{a,180}$, $SRM_{b,180}$, $SRM_{a,90}$, and $SRM_{b,90}$.

The relationship between function, h, and the parameters of interest, OA and TA, can be determined for nominal values of CD and H, but the relationship does not hold for arbitrary CD and H. To address this issue, computing system 130 executes linear least squares regression to map spectral response metrics, SRM, associated with general values of CD and H to normalized spectral response metrics, SRM', associated with known, nominal values of CD and H, where SRM' is illustrated by equation (14).

$$SRM' = SRM(CD_{Nom}, H_{Nom}, TA, OA) = g(CD_{Nom}, H_{Nom}) \cdot h(TA, OA) \quad (14)$$

A spectral response metric, SRM, is related to the normalized spectral response metric, SRM', by normalization factor, $g(CD,H)/g(CD_{NOM}, H_{NOM})$, as illustrated by equation (15).

$$SRM(CD, H, TA, OA) = SRM'(TA, OA) \frac{g(CD, H)}{g(CD_{Nom}, H_{Nom})} \quad (15)$$

Assuming nominal, non-trivial values for TA and OA, computing system 130 generates a number of spectral response metrics, SRM, associated with measurements of hole features having N different values of CD and M different values of H and a set of spectral response metrics associated with measurement of a hole feature at the chosen nominal values for CD and H.

The unknown coefficients $(C_0, \ldots, C_N)$ and $(D_0, \ldots, D_M)$ illustrated in equation (16) are resolved using linear least squares regression to arrive at a model for the normalization factor, $g(CD,H)/g(CD_{NOM}, H_{NOM})$.

$$\begin{bmatrix} 1 & CD & \cdots & CD^N & H & \cdots & H^M \\ \vdots & \vdots & \vdots & \vdots & \vdots & \vdots & \vdots \end{bmatrix} \cdot \begin{bmatrix} C_0 \\ \vdots \\ C_N \\ D_1 \\ \vdots \\ D_M \end{bmatrix} = \quad (16)$$

$$\begin{bmatrix} \frac{SRM(CD, H, TA_{Nom}, OA_{Nom})}{SRM(CD_{Nom}, H_{Nom}, TA_{Nom}, OA_{Nom})} \\ \vdots \end{bmatrix} = \frac{g(CD, H,)}{g(CD_{Nom}, H_{Nom})}$$

Assuming the nominal values of CD and H, computing system 130 generates a number of normalized spectral response metrics, SRM', associated with varying values of TA and OA.

The unknown coefficients $A_1$ and $A_2$ illustrated in equation (17) are resolved using linear least squares regression.

$$\begin{bmatrix} SRM'^2_{a,180} + SRM'^2_{a,90} & SRM'^2_{b,180} + SRM'^2_{b,90} \\ \vdots & \vdots \end{bmatrix} \cdot \begin{bmatrix} A_1 \\ A_2 \end{bmatrix} = \quad (17)$$

$$\begin{bmatrix} [H \cdot \tan(TA)]^2 \\ \vdots \end{bmatrix}$$

The unknown coefficients $B_1$ and $B_2$ illustrated in equation (18) are also resolved using linear least squares regression.

$$\begin{bmatrix} SRM'_{a,180} & SRM'_{b,180} \\ SRM'_{a,90} & SRM'_{b,90} \\ \vdots & \vdots \end{bmatrix} \cdot \begin{bmatrix} B_1 \\ B_2 \end{bmatrix} = \begin{bmatrix} \sin(OA) \cdot H \cdot \tan(TA) \\ \cos(OA) \cdot H \cdot \tan(TA) \\ \vdots \end{bmatrix} \quad (18)$$

The results of equations (11)-(18) are combined to arrive at a trained linear model relating the asymmetry parameters of interest, OA and TA, to spectral response metrics derived from measurements of asymmetric structures. In this manner, values for the trained linear model is illustrated by equations (19)-(21).

$$SRM'_{(a,b),(90,180)} = \frac{SRM_{(a,b),(90,180)}(CD, H, TA, OA)}{C_0 + C_1 \cdot CD + \cdots + C_N \cdot CD^N + D_1 \cdot H + \cdots + D_M \cdot H^M} \quad (19)$$

$$TA = \tan^{-1}\left(\frac{\sqrt{A_1 \cdot (SRM'^2_{a,180} + SRM'^2_{a,90}) + A_2 \cdot (SRM'^2_{b,180} + SRM'^2_{b,90})}}{H}\right) \quad (20)$$

$$OA = \text{atan2}(B_1 \cdot SRM'_{a,180} + B_2 \cdot SRM'_{b,180}, B_1 \cdot SRM'_{a,90} + B_2 \cdot SRM'_{b,90}) \quad (21)$$

Figure 6:
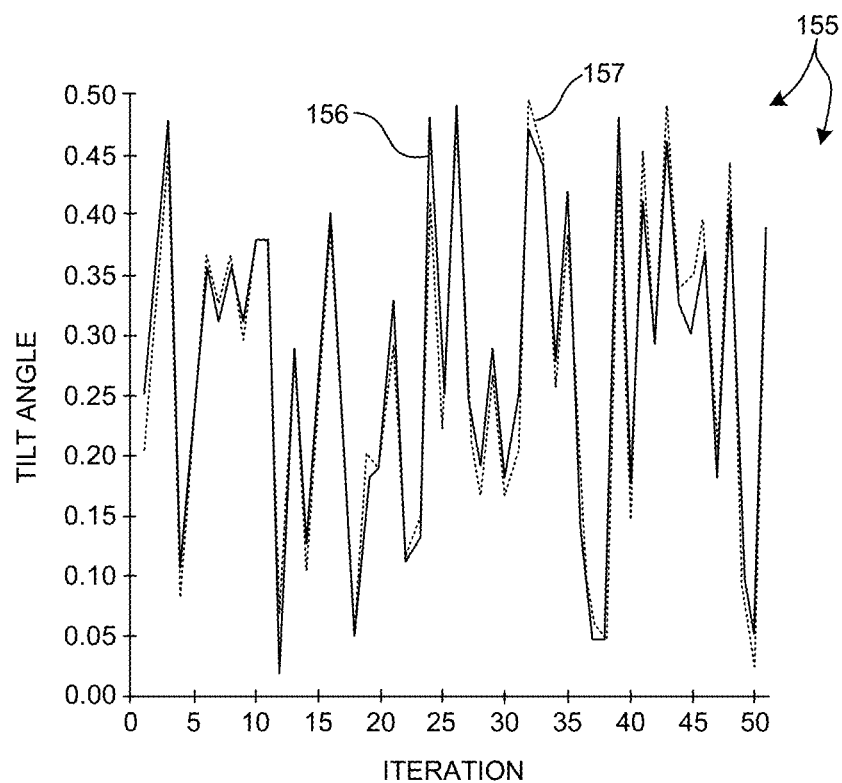
FIG. 6 depicts a plot of simulated results illustrating a comparison between actual tilt angles associated with the simulation and regressed values of the tilt angles estimated by a trained linear model described herein.
Figure 7:
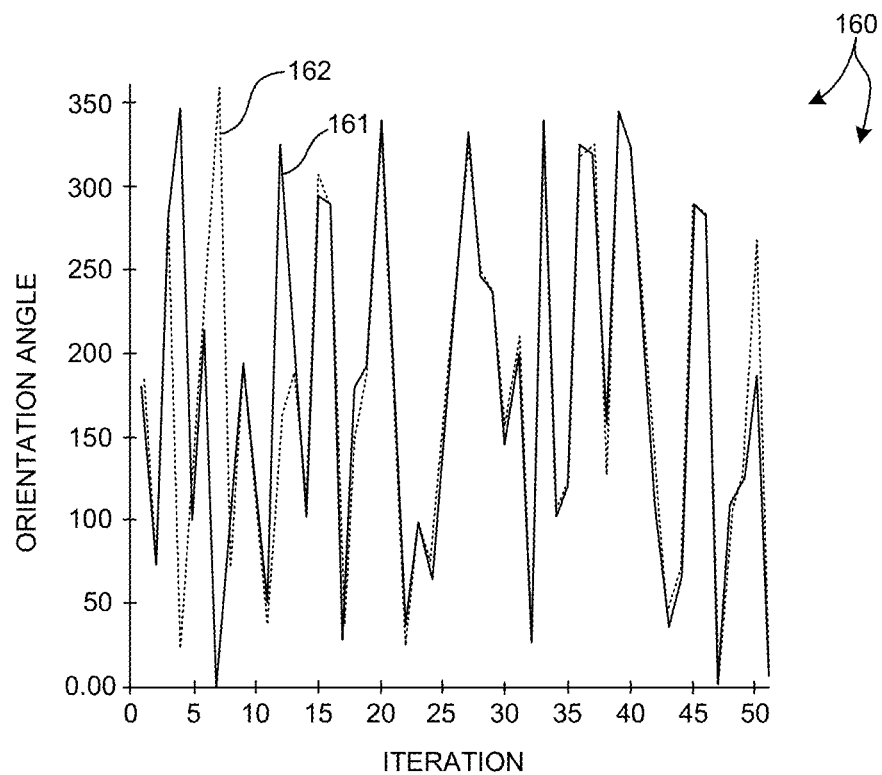
FIG. 7 depicts a plot of simulated results illustrating a comparison between actual orientation angles associated with the same simulation depicted in FIG. 6 and regressed values of the orientation angles estimated by a trained linear model described herein.

FIG. 6 depicts a plot 155 of simulated results illustrating a comparison between actual tilt angles 156 associated with the simulation and regressed values of the tilt angles 157 using the trained linear model described with reference to equations (11)-(21). FIG. 7 depicts a plot 160 of simulated results illustrating a comparison between actual orientation angles 161 associated with the same simulation and regressed values of the orientation angles 162 using the trained linear model described with reference to equations (11)-(21). In this example, CD and H of the tilted hole feature are varied randomly over a range of 5%, the tilt angle varies from 0° to 0.5°, and the orientation angle varies from 0° to 360°. The simulated measurement signals were injected with random Gaussian noise and a single wavelength subsection was used for determination of the spectral response metrics. As depicted in FIG. 6, the estimated values of tilt angle track well with the actual tilt angle values. Similarly, as depicted in FIG. 7, the estimated values of orientation angle track well with the actual orientation angle values.

In some examples, computing system 130 generates a trained neural network model that is subsequently employed to estimate values of TA and OA.

In some examples, a neural network model is trained to map the spectral response metrics described hereinbefore and the reliably regressed critical dimensions to values of one or more geometric parameters characterizing an asymmetric feature under measurement.

In one example, the training input of a neural network model includes the four spectral response metrics described with reference to equations (7)-(10), i.e., $SRM_{a,180}$, $SRM_{b,180}$, $SRM_{a,90}$, and $SRM_{b,90}$, and the reliably regressed values of CD and Height. The training output includes the normalization factor, $g(CD,H)/g(CD_{NOM},H_{NOM})$. In some examples, the linear least squares regression described hereinbefore is employed using the normalization factor determined by the trained neural network.

In one example, a neural network of 20 neurons with 2 hidden layers is trained to predict the normalization factor, $g(CD,H)/g(CD_{NOM},H_{NOM})$. Input data is generated from synthetic spectra associated with randomly varying values of CD, height, TA, and OA in the same manner as described with reference to FIGS. 6 and 7. The nominal CD and height are chosen from a single random profile in the training data. The linear least squares regression described hereinbefore is employed using the normalization factor determined by the trained neural network.

Figure 8:
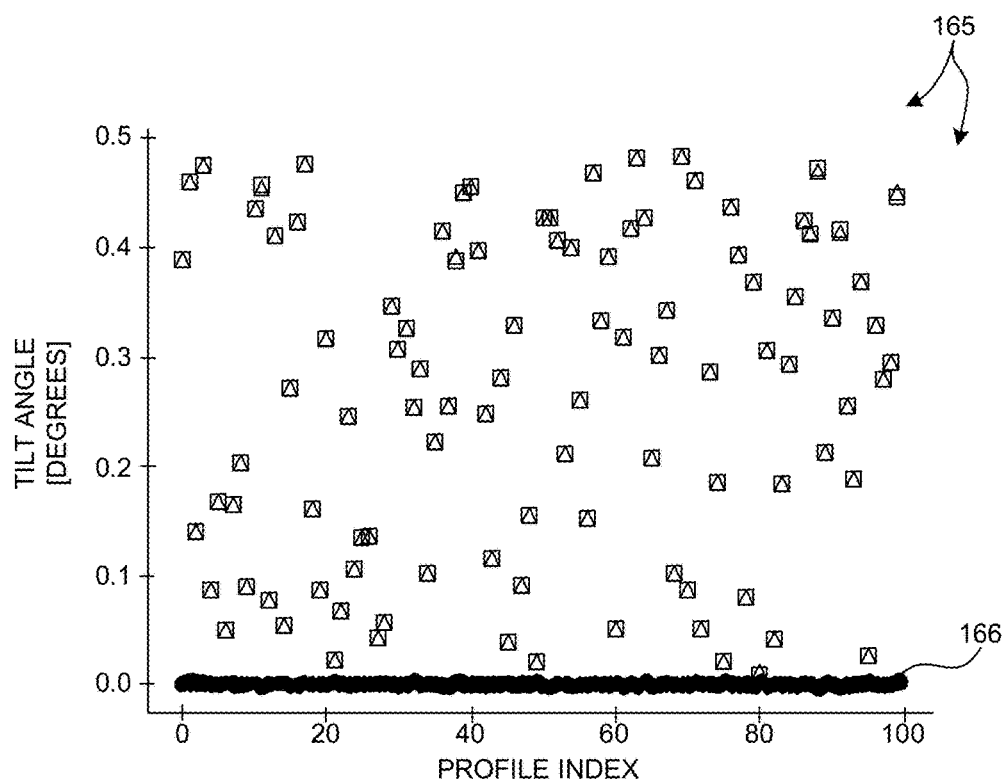
FIG. 8 depicts a plot of simulated results illustrating a comparison between actual tilt angles and regressed values of the tilt angles estimated by a combination of a neural network model and a trained linear model.

FIG. 8 depicts a plot 165 of simulated results illustrating a comparison between actual tilt angles depicted with triangular shaped reference marks and regressed tilt angle values depicted with square shaped reference marks. The differences between the actual and regressed values are illustrated by plotline 166. In this example, the three-sigma value (i.e., three times the standard deviation) of the difference between actual and regressed values of the tilt angle is 0.00298.

Figure 9:
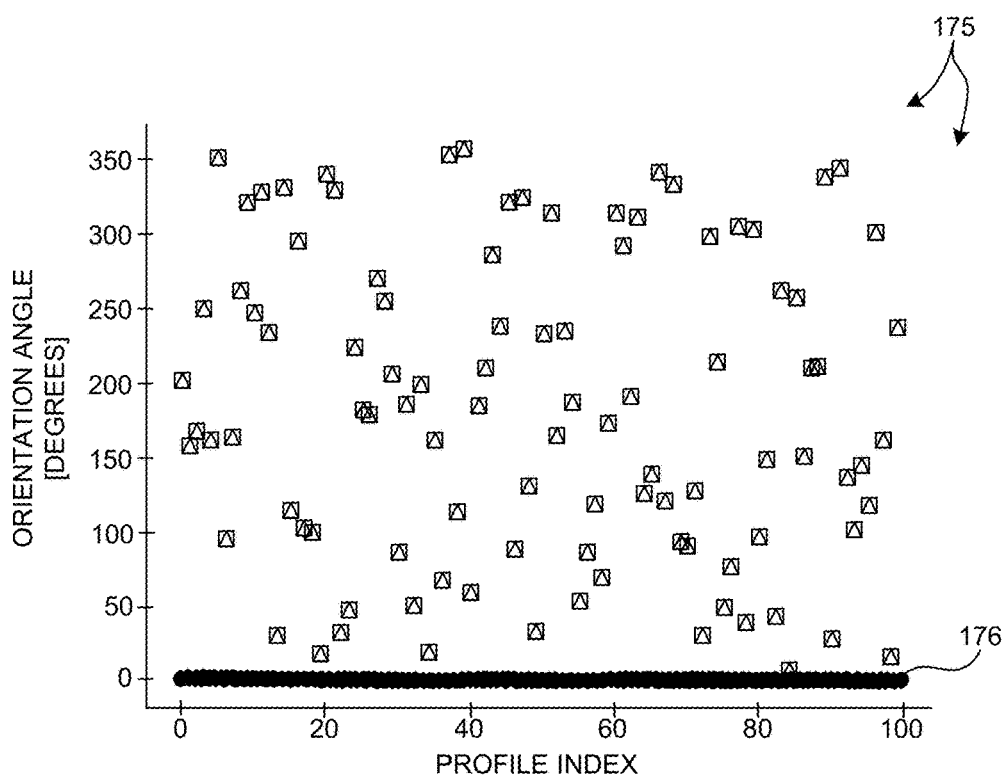
FIG. 9 depicts a plot of simulated results illustrating a comparison between actual orientation angles and regressed values of the orientation angles estimated by a combination of a neural network model and a trained linear model.

FIG. 9 depicts a plot 175 of simulated results illustrating a comparison between actual orientation angles depicted with triangular shaped reference marks and regressed orientation angle values depicted with square shaped reference marks. The differences between the actual and regressed values are illustrated by plotline 176. In this example, the three-sigma value (i.e., three times the standard deviation) of the difference between actual and regressed values of the orientation angle is 0.19000.

In another example, instead of employing linear regression to estimate values of the asymmetry parameters, yet another neural network model is trained to determine TA and OA based on the normalization factor and the measured inputs.

In another example, the training input of a neural network model includes the four spectral response metrics described with reference to equations (7)-(10), i.e., $SRM_{a,180}$, $SRM_{b,180}$, $SRM_{a,90}$, and $SRM_{b,90}$, and the reliably regressed values of CD and Height. The training output includes corresponding values of TA and OA.

Figure 10:
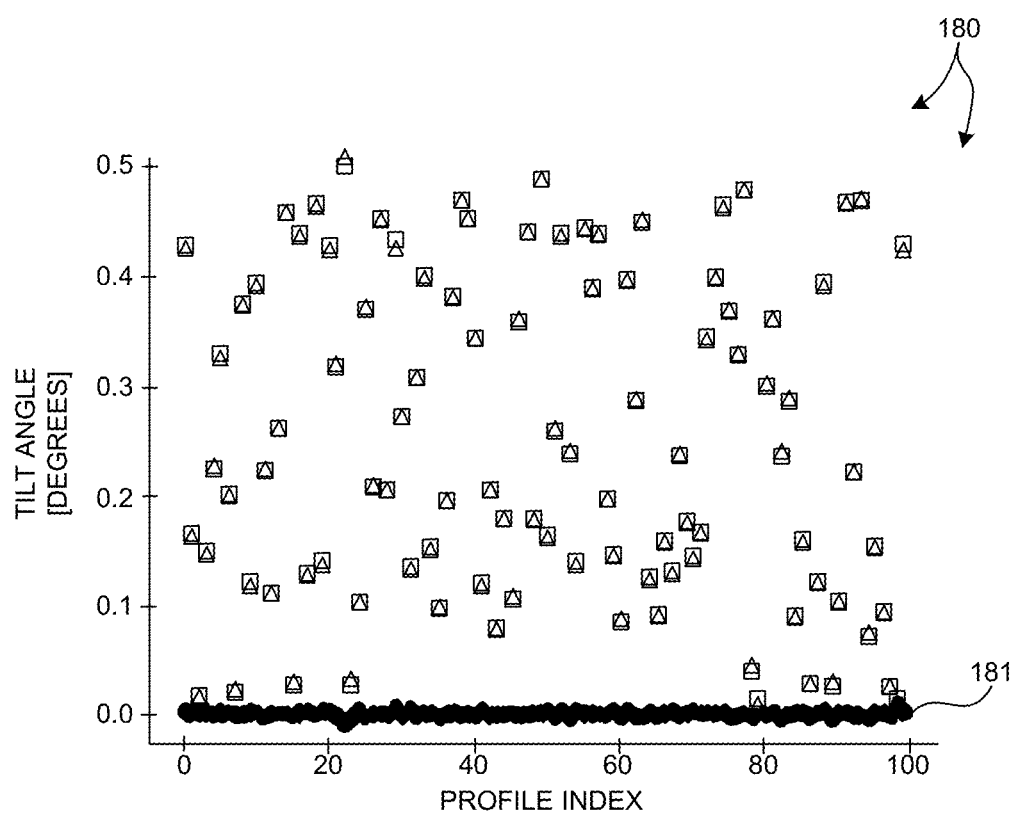
FIG. 10 depicts a plot of simulated results illustrating a comparison between actual tilt angles and regressed values of the tilt angles estimated by a trained neural network model.

FIG. 10 depicts a plot 180 of simulated results employing a trained neural network model to directly estimate TA and OA from the four spectral response metrics and the reliably regressed values of CD and Height. FIG. 10 illustrates a comparison between actual tilt angles depicted with triangular shaped reference marks and regressed tilt angle values depicted with square shaped reference marks. The differences between the actual and regressed values are illustrated by plotline 181. In this example, the three-sigma value (i.e., three times the standard deviation) of the difference between actual and regressed values of the tilt angle is 0.00783.

In yet another example, the training input of a neural network model includes the four spectral response metrics described with reference to equations (7)-(10), but not the reliably regressed values of CD and Height. The training output includes corresponding values of TA and OA. Simulation results validating this approach show that the three-sigma value of the difference between actual and regressed values of the tilt angle is 0.18000, which is not as effective as the previously described approaches.

In general, the methods of determining values of one or more geometric parameters describing an asymmetric feature of a structure of interest described herein are effectively applied in an iterative manner. In some examples, the estimated values of the asymmetry parameters are fed forward to the spectral matching analysis to arrive at improved estimates of one or more critical dimensions. These improved estimates of critical dimensions are used to update the spectral response metrics, which, in turn, are used to generate improved estimates of the asymmetric parameters. This iteration continues until convergence on values of the asymmetry parameters. The estimated values of the asymmetry parameters are saved in a memory (e.g., memory 132).

In some embodiment, multiple different spectral response metrics are determined, each based on a different off-diagonal Mueller matrix element or combination of Mueller matrix elements (e.g., $M_{30}$ and the sum ($M_{20}+M_{02}$)). In a further aspect, different spectral response metrics are weighed differently, e.g., by scaling each spectral response metrics with a different constant. In this manner, spectral response metrics that are more sensitive to specific asymmetry parameters are weighed more heavily than spectral response metrics that are less sensitive to the specific asymmetry parameters.

Figure 12:
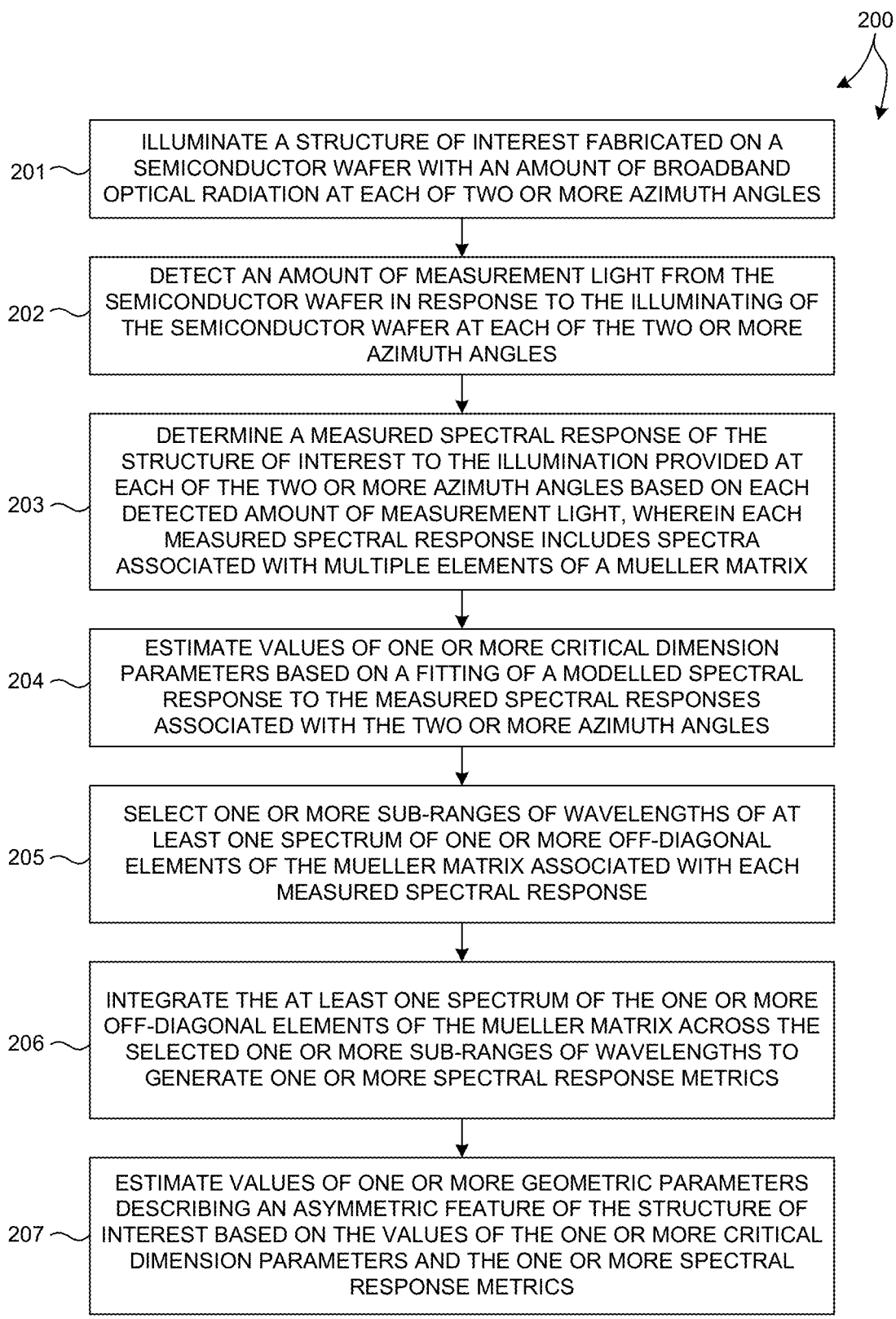
FIG. 12 illustrates a method 200 of performing spectroscopic measurements of asymmetric structural features in at least one novel aspect.

FIG. 12 illustrates a method 200 of performing spectroscopic measurements of asymmetric parameters in at least one novel aspect. Method 200 is suitable for implementation by a metrology system such as metrology system 100 illustrated in FIG. 1 of the present invention. In one aspect, it is recognized that data processing blocks of method 200 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 201, a structure of interest fabricated on a semiconductor wafer is illuminated with an amount of broadband optical radiation at each of two or more distinct azimuth angles.

In block 202, an amount of measurement light is detected from the semiconductor wafer in response to the illuminating of the semiconductor wafer at each of the two or more azimuth angles.

In block 203, a measured spectral response of the structure of interest to the illumination provided at each of the two or more azimuth angles is determined based on each detected amount of measurement light. Each measured spectral response includes spectra associated with multiple elements of a Mueller matrix.

In block 204, values of one or more critical dimension parameters are estimated based on a fitting of a modelled spectral response to the measured spectral responses associated with the two or more azimuth angles.

In block 205, one or more sub-ranges of wavelengths of at least one spectrum of one or more off-diagonal elements of the Mueller matrix associated with each measured spectral response are selected.

In block 206, the at least one spectrum of the one or more off-diagonal elements of the Mueller matrix is integrated across the selected one or more sub-ranges of wavelengths to generate one or more spectral response metrics.

In block 207, values of one or more geometric parameters describing an asymmetric feature of the structure of interest are estimated based on the values of the one or more critical dimension parameters and the one or more spectral response metrics.

Exemplary measurement techniques that may be configured as described herein include, but are not limited to spectroscopic ellipsometry (SE), including Mueller matrix ellipsometry (MMSE), rotating polarizer SE (RPSE), rotating polarizer, rotating compensator SE (RPRC), rotating compensator, rotating compensator SE (RCRC), spectroscopic reflectometry (SR), including polarized SR, unpolarized SR, spectroscopic scatterometry, scatterometry overlay, beam profile reflectometry, both angle-resolved and polarization-resolved, beam profile ellipsometry, single or multiple discrete wavelength ellipsometry, etc. In general, any metrology technique that includes a wide range of angular information in the measurement signals may be contemplated, individually, or in any combination. For example, any SR or SE technique applicable to the characterization of semiconductor structures, including image based metrology techniques, may be contemplated, individually, or in any combination.

In a further embodiment, system 100 includes one or more computing systems 130 employed to perform measurements of actual device structures based on spectroscopic measurement data collected in accordance with the methods described herein. The one or more computing systems 130 may be communicatively coupled to the spectrometer. In one aspect, the one or more computing systems 130 are configured to receive measurement data 170 associated with measurements of the structure of specimen 120.

It should be recognized that one or more steps described throughout the present disclosure may be carried out by a single computer system 130 or, alternatively, a multiple computer system 130. Moreover, different subsystems of system 100 may include a computer system suitable for carrying out at least a portion of the steps described herein. Therefore, the aforementioned description should not be interpreted as a limitation on the present invention but merely an illustration.

In addition, the computer system 130 may be communicatively coupled to the spectrometers in any manner known in the art. For example, the one or more computing systems 130 may be coupled to computing systems associated with the spectrometers. In another example, the spectrometers may be controlled directly by a single computer system coupled to computer system 130.

The computer system 130 of metrology system 100 may be configured to receive and/or acquire data or information from the subsystems of the system (e.g., spectrometers and the like) by a transmission medium that may include wireline and/or wireless portions. In this manner, the transmission medium may serve as a data link between the computer system 130 and other subsystems of system 100.

Computer system 130 of metrology system 100 may be configured to receive and/or acquire data or information (e.g., measurement results, modeling inputs, modeling results, reference measurement results, etc.) from other systems by a transmission medium that may include wireline and/or wireless portions. In this manner, the transmission medium may serve as a data link between the computer system 130 and other systems (e.g., memory on-board metrology system 100, external memory, or other external systems). For example, the computing system 130 may be configured to receive measurement data from a storage medium (i.e., memory 132 or an external memory) via a data link. For instance, spectral results obtained using the spectrometers described herein may be stored in a permanent or semi-permanent memory device (e.g., memory 132 or an external memory). In this regard, the spectral results may be imported from on-board memory or from an external memory system. Moreover, the computer system 130 may send data to other systems via a transmission medium. For instance, a measurement model or an estimated parameter value 171 determined by computer system 130 may be communicated and stored in an external memory. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

In some examples, the measurement models described herein are implemented as an element of a SpectraShape® optical critical-dimension metrology system available from KLA-Tencor Corporation, Milpitas, Calif., USA. In this manner, the model is created and ready for use immediately after the spectra are collected by the system.

In some other examples, the measurement models described herein are implemented off-line, for example, by a computing system implementing AcuShape® software available from KLA-Tencor Corporation, Milpitas, Calif., USA. The resulting, trained model may be incorporated as an element of an AcuShape® library that is accessible by a metrology system performing measurements.

Figure 11:
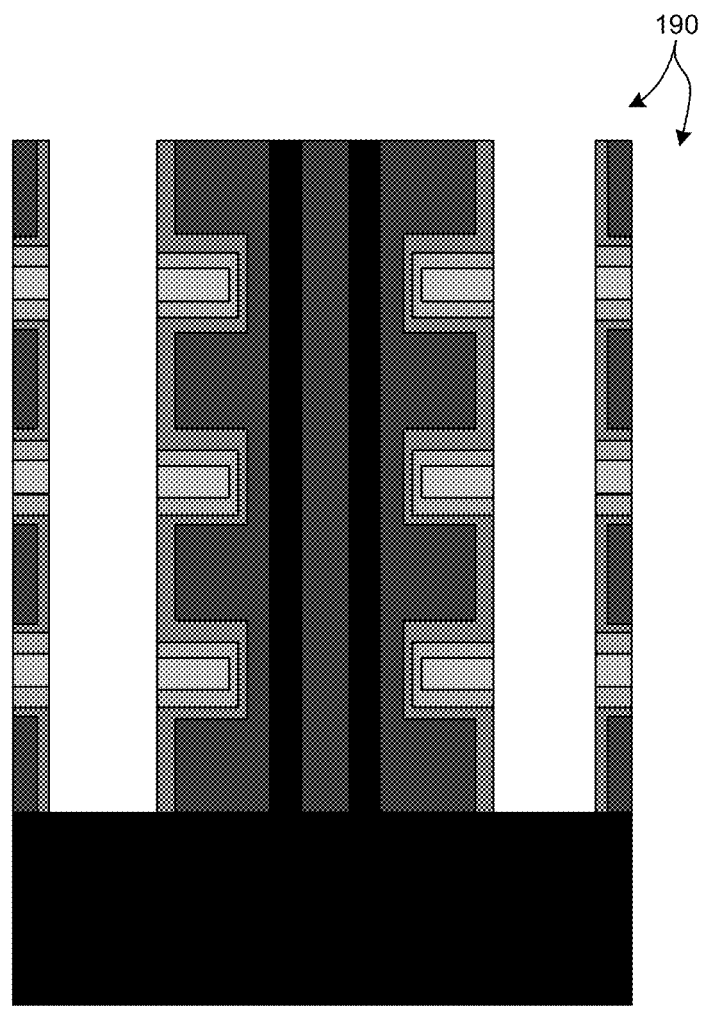
FIG. 11 depicts an exemplary high aspect ratio NAND structure of interest.

In another aspect, the methods and systems for spectroscopic metrology of semiconductor devices described herein are applied to the measurement of asymmetric features of high aspect ratio (HAR) structures, large lateral dimension structures, or both. The described embodiments enable metrology of asymmetric features of semiconductor devices including three dimensional NAND structures, such as vertical-NAND (V-NAND) structures, dynamic random access memory structures (DRAM), etc., manufactured by various semiconductor manufacturers such as Samsung Inc. (South Korea), SK Hynix Inc. (South Korea), Toshiba Corporation (Japan), and Micron Technology, Inc. (United States), etc. FIG. 11 depicts an exemplary high aspect ratio NAND structure 190 that may include asymmetric feature defects. A spectroscopic ellipsometer with broadband capability and wide ranges of azimuth angle is suitable for measurements of these high-aspect ratio structures. HAR structures often include hard mask layers to facilitate etch processes for HARs. As described herein, the term "HAR structure" refers to any structure characterized by an aspect ratio that exceeds 10:1 and may be as high as 100:1, or higher.

In yet another aspect, the measurement results described herein are provided as active feedback to a fabrication process tool (e.g., lithography tool, etch tool, deposition tool, etc.). For example, values of measured parameters determined based on measurement methods described herein are communicated to a lithography tool to adjust the lithography system to achieve a desired output (i.e., reduced asymmetry errors, etc.). In a similar way etch parameters (e.g., etch time, diffusivity, etc.) or deposition parameters (e.g., time, concentration, etc.) are adjusted based on active feedback of the measured parameters to etch tools or deposition tools, respectively. In some examples, corrections to process parameters determined based on measured asymmetric parameters are communicated to a lithography tool, etch tool, deposition tool, etc. In response, a fabrication tool adjusts a control parameter of the semiconductor fabrication process to reduce structural defects characterized by the measured asymmetry.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor measurement system that may be used for measuring a specimen within any semiconductor processing tool (e.g., an inspection system or a lithography system). The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
    an illumination source configured to generate an amount of broadband optical radiation;
    one or more optical elements that direct the amount of broadband optical radiation from the illumination source to a measurement spot on a surface of a semiconductor wafer at each of two or more azimuth angles;
    a spectrometer configured to detect an amount of measurement light from the semiconductor wafer in response to the illuminating of the semiconductor wafer at each of the two or more azimuth angles and determine a measured spectral response of a structure of interest to the illumination based on each detected amount of measurement light, wherein each measured spectral response includes spectra associated with multiple elements of a Mueller matrix; and a computing system configured to:

estimate values of one or more critical dimension parameters characterizing the structure of interest based on a fitting of a modelled spectral response to the measured spectral responses associated with the two or more azimuth angles;

select one or more sub-ranges of wavelengths of at least one spectrum of one or more off-diagonal elements of the Mueller matrix associated with each measured spectral response;

integrate the at least one spectrum of the one or more off-diagonal elements of the Mueller matrix across the selected one or more sub-ranges of wavelengths to generate one or more spectral response metrics; and estimate values of one or more geometric parameters describing an asymmetric feature of the structure of interest based on the values of the one or more critical dimension parameters and the one or more spectral response metrics.

2. The metrology system of claim 1, the computing system further configured to:

communicate the values of the one or more geometric parameters to a semiconductor fabrication tool, wherein the semiconductor fabrication tool adjusts a control parameter of a semiconductor fabrication process based on the values of the one or more geometric parameters to reduce structural defects characterized by the measured asymmetry.

3. The metrology system of claim 1, wherein the two or more azimuth angles include two azimuth angles perpendicular to one another.

4. The metrology system of claim 1, wherein the one or more off-diagonal elements of the Mueller matrix includes the $M_{30}$ element of the Mueller matrix.

5. The metrology system of claim 1, wherein the one or more off-diagonal elements of the Mueller matrix includes a sum of the $M_{20}$ and $M_{02}$ elements of the Mueller matrix.

6. The metrology system of claim 1, wherein the selecting of the one or more sub-ranges of wavelengths of at least one spectrum of one or more off-diagonal elements of the Mueller matrix involves selecting one or more sub-ranges of wavelengths having a spectral response that exceeds a predetermined threshold value within the one or more sub-ranges of wavelengths.

7. The metrology system of claim 1, wherein the estimating of the values of the one or more geometric parameters is based on a plurality of spectral response metrics, wherein each of the plurality of spectral response metrics are weighed differently.

8. The metrology system of claim 1, wherein the one or more geometric parameters describing an asymmetric feature of the structure of interest includes any of a tilt angle and an orientation angle of a hole feature.

9. The metrology system of claim 1, wherein the structure of interest is a high aspect ratio memory structure.

10. The metrology system of claim 1, wherein the estimating of the values of the one or more geometric parameters involves a trained neural network model that relates the values of the one or more critical dimension parameters and the one or more spectral response metrics to the values of the one or more geometric parameters.

11. The metrology system of claim 1, wherein the estimating of the values of the one or more geometric parameters involves a linear regression model that relates the values of the one or more critical dimension parameters and the one or more spectral response metrics to the one or more geometric parameters.

12. A method comprising:

illuminating a structure of interest fabricated on a semiconductor wafer with an amount of broadband optical radiation at each of two or more azimuth angles;

detecting an amount of measurement light from the semiconductor wafer in response to the illuminating of the semiconductor wafer at each of the two or more azimuth angles;

determining a measured spectral response of the structure of interest to the illumination provided at each of the two or more azimuth angles based on each detected amount of measurement light, wherein each measured spectral response includes spectra associated with multiple elements of a Mueller matrix;

estimating values of one or more critical dimension parameters based on a fitting of a modelled spectral response to the measured spectral responses associated with the two or more azimuth angles;

selecting one or more sub-ranges of wavelengths of at least one spectrum of one or more off-diagonal elements of the Mueller matrix associated with each measured spectral response;

integrating the at least one spectrum of the one or more off-diagonal elements of the Mueller matrix across the selected one or more sub-ranges of wavelengths to generate one or more spectral response metrics; and estimating values of one or more geometric parameters describing an asymmetric feature of the structure of interest based on the values of the one or more critical dimension parameters and the one or more spectral response metrics.

13. The method of claim 12, further comprising:

communicating the values of the one or more geometric parameters to a semiconductor fabrication tool, wherein the semiconductor fabrication tool adjusts a control parameter of a semiconductor fabrication process based on the values of the one or more geometric parameters to reduce structural defects characterized by the measured asymmetry.

14. The method of claim 12, wherein the two or more azimuth angles include two azimuth angles perpendicular to one another.

15. The method of claim 12, wherein the selecting of the one or more sub-ranges of wavelengths of at least one spectrum of one or more off-diagonal elements of the Mueller matrix involves selecting one or more sub-ranges of wavelengths having a spectral response that exceeds a predetermined threshold value within the one or more sub-ranges of wavelengths.

16. The method of claim 12, wherein the estimating of the values of one or more geometric parameters involves a trained neural network model that relates the one or more geometric parameters to the values of the one or more critical dimension parameters and the one or more spectral response metrics.

17. The method of claim 12, wherein the estimating of the values of one or more geometric parameters involves a linear regression model that relates the one or more geometric parameters to the values of the one or more critical dimension parameters and the one or more spectral response metrics.

18. The method of claim 12, wherein the one or more off-diagonal elements of the Mueller matrix includes a sum of at least two elements of the Mueller matrix.

19. A metrology system comprising:
one or more optical elements that direct an amount of broadband optical radiation from an illumination source to a measurement spot on a surface of a semiconductor wafer;
a spectrometer configured to detect an amount of measurement light from the semiconductor wafer in response to the illuminating of the semiconductor wafer and determine a measured spectral response of a structure of interest based the detected amount of measurement light, wherein the measured spectral response includes spectra associated with multiple elements of a Mueller matrix; and
a computer-readable medium comprising instructions, that when executed by one or more processors, cause the one or more processors to:
estimate values of one or more critical dimension parameters based on a fitting of a modelled spectral response to the measured spectral response;
select one or more sub-ranges of wavelengths of at least one spectrum of one or more off-diagonal elements of the Mueller matrix associated with the measured spectral response;
integrate the at least one spectrum of the one or more off-diagonal elements of the Mueller matrix across the selected one or more sub-ranges of wavelengths to generate one or more spectral response metrics; and
estimate values of one or more geometric parameters describing an asymmetric feature of the structure of interest based on the values of the one or more critical dimension parameters and the one or more spectral response metrics.

20. The metrology system of claim 19, the computer-readable medium further comprising instructions, that when executed by the one or more processors, cause the one or more processors to:
communicate the values of the one or more geometric parameters to a semiconductor fabrication tool, wherein the semiconductor fabrication tool adjusts a control parameter of a semiconductor fabrication process based on the values of the one or more geometric parameters to reduce structural defects characterized by the measured asymmetry.

* * * * *